United States Patent
Suzuki et al.

[11] Patent Number: 5,641,606
[45] Date of Patent: Jun. 24, 1997

[54] PHASE-CHANGE OPTICAL DISKS AND PROCESSES FOR PREPARING THE SAME

[75] Inventors: Masaru Suzuki; Kazuhiro Nishimura, both of Fuji, Japan

[73] Assignee: Asahi Kasei Kogyo Kabushiki Kaisha, Osaka, Japan

[21] Appl. No.: 513,994

[22] PCT Filed: Oct. 5, 1994

[86] PCT No.: PCT/JP94/01666

§ 371 Date: Sep. 5, 1995

§ 102(e) Date: Sep. 5, 1995

[87] PCT Pub. No.: WO96/11471

PCT Pub. Date: Apr. 18, 1996

[51] Int. Cl.⁶ .................................. G11B 7/24; G11B 7/26
[52] U.S. Cl. ..................... 430/270.13; 430/945; 427/164
[58] Field of Search ........................ 430/270.13, 945, 430/273.1; 427/164; 369/284, 288

[56] References Cited

U.S. PATENT DOCUMENTS

| | | | |
|---|---|---|---|
| 4,670,345 | 6/1987 | Morimoto et al. | 428/411.1 |
| 4,847,132 | 7/1989 | Takao et al. | 428/64.6 |
| 4,954,379 | 9/1990 | Nishida et al. | 430/270.13 |
| 5,453,346 | 9/1995 | Kawahara et al. | 430/945 |

FOREIGN PATENT DOCUMENTS

| | | | |
|---|---|---|---|
| 61-217943 | 9/1986 | Japan. | |
| 1-211249 | 8/1989 | Japan | 430/270.13 |
| 3-097585 | 4/1991 | Japan. | |
| 3-097584 | 4/1991 | Japan. | |
| 3-263627 | 11/1991 | Japan. | |
| 4-012886 | 1/1992 | Japan. | |

OTHER PUBLICATIONS

Dialog abstract of Japanese Patent Application Laid–open No. 263627/1991, (Nov. 1991).
Dialog abstract of Japanese Patent Application Laid–open No. 152738/1991, (Jun. 1991).

*Primary Examiner*—John A. McPherson
*Attorney, Agent, or Firm*—Birch, Stewart, Kolasch & Birch, LLP

[57] ABSTRACT

The present invention relates to a phase-change type optical disk comprising a transparent substrate; a recording layer arranged on the transparent substrate wherein a phase-change occurs between crystalline state and amorphous state according to laser power irradiation; and protective layers arranged on and directly under the recording layer; the composition of the recording layer being represented by the general formula $(Sb_a Te_b Ge_c)_{100-d} \cdot S_d$, wherein $5 \leq a \leq 60$, $35 \leq b \leq 65$, $5 \leq c \leq 65$, $a+b+c=100$ and $0 < d \leq 40$, and/or one or both of the protective layers comprising a mixture of $Zn_{(1-x)}S_x$ wherein $0.50 < x$ and one or more oxides, nitrides, fluorides, carbides and sulfides of metals or semimetals (proviso provided that sulfides are excluded when the metal is Zinc). The optical disk of the present invention is improved in a cyclability, i.e., number of overwrite cycles and error correctable cycles, and reduces deterioration of recording marks due to long term reading.

16 Claims, 1 Drawing Sheet

PHASE-CHANGE OPTICAL DISKS AND PROCESSES FOR PREPARING THE SAME

TECHNICAL FIELD

The present invention relates to a phase-change type optical disk which shows a high cyclability and reduces deterioration of recording marks due to long term reading, and to a process for preparing the same.

BACKGROUND ART

A phase-change type optical disk has a recording layer on a transparent substrate. The recording layer comprises a material which changes its phase between amorphous state and crystalline state upon irradiation with laser power and which is capable of erasing old information and recording new one at the same time only by changing laser power (hereinafter, overwriting).

Chalcogen alloy such as In-Se alloys, In-Sb-Te alloy and Ge-Te-Sb alloy (U.S. Pat. No. 4,670,345) have been generally used as a recording material in phase-change type recordable and erasable optical disks. According to overwriting, some areas of a recording layer are irradiated with a high power laser beam to become amorphous since the recording materials are heated rapidly at their melting point or more and cooled rapidly to form recording marks; and the other areas of the recording layer are irradiated with a crystallizing laser power and are crystallized since the recording materials are heated below their melting point and cooled gradually to form erased areas.

Such overwriting is carried out by irradiating optical disks to a laser beam while the disks are rotated at a specific linear velocity on a drive unit. In order to complete the erasing by one time laser passing, the crystallizing speed of the recording material, i.e., transformation speed between amorphous state and crystalline state, must be higher than the crystallizing of recording marks per time required for a laser beam to pass through a certain point on an optical disk. Since the time required for a laser beam to pass through a certain point on an optical disk depends on a rotary speed (linear velocity), the crystallizing speed of the recording material must be higher than the rotary speed. When the crystallizing speed is increased or a crystallizing temperature is decreased so as to increase an erasing speed in regulation of the conditions for overwriting, recording marks (amorphous areas) formed by recording gradually transform into a crystalline phase having a lower energy level and are deteriorated during long term reading. As a result, the recording marks disappear and reliability of the recording data is lost.

Conventionally, transition metals have been added to a chalcogen alloy, or an amount of Ge in Sb—Te—Ge alloy has been increased, in order to avoid deterioration of recoding marks by long term reading. In the former process, though the addition of some 1 at % of transition metals increases stability of the recording marks, though it decreases erasing speed. Therefore, materials used particularly as media for recording at a high speed are limited, and contrast of reflectance is reduced because of a small difference in optical constant between amorphous and crystalline areas. In the latter process, as the amount of Ge increases, the melting point of the recording layer rises and the recording sensitivity is unfavorably decreased.

When optical disks having a recording layer of a chalcogen alloy are recorded and erased, protective layers are generally arranged on, directly under, or on both sides of the recording layer by deposition or sputtering in order to prevent a substrate from deforming with heating while recording and erasing, and to prevent the recording layer from deforming and oxidizing. Oxides, carbides, nitrides, fluorides, and sulfides of metals or semimetals have been known as materials for protective layers. Of these, ZnS is especially known for its strong adherence toward a recording layer. However, a protective layer made only from ZnS is insufficient in heat resistance since crystalline grains of ZnS are coarsened by repeated recording and erasing in overwriting.

Japanese Patent Application Laid-Open No. 103453/1988 discloses an optical disk which is enhanced in heat resistance of protective layers and is improved in the reduction of the cyclability caused by heat deformation of recording layers since glassy materials such as $SiO_2$ are added to ZnS. In order to reduce the degradation of recording layers due to movement of recording materials caused by laser beam irradiation, Japanese Patent Application Laid-Open Nos. 263627/1991 and 152738/1991 propose to add oxygen or nitrogen, and hydrogen to the protective layers, respectively. However, conventional optical disks are insufficient in reliability of cyclability so that there has been a great demand for improving cyclability.

The present invention has been completed taking note of the drawbacks the conventional art has. An object of the present invention is to provide a phase-change type optical disk showing an excellent cyclability and less deterioration of recording marks formed by recording, which optical disk is attained by including a specific amount of sulfur in a recording layer comprising an alloy of specific components and/or in protective layers arranged on and directly under the recording layer. Another object is to provide a process for producing such a phase-change type optical disk.

DISCLOSURE OF THE INVENTION

The present invention relates to phase-change type optical disks comprising a transparent substrate; a recoding layer arranged on the transparent substrate wherein a phase-change occurs between crystalline state and amorphous state according to the laser power irradiation; and protective layers arranged on and directly under the recording layer; the composition of the recording layer being represented by the general formula $(Sb_aTe_bGe_c)_{100-d}S_d$, wherein $5 \leq a \leq 60$, $35 \leq b \leq 65$, $5 \leq c \leq 65$, $a+b+c=100$ and $0 < d \leq 40$, and/or one or both of the protective layers comprising a mixture of $Zn_{(1-x)}S_x$ wherein $0.50 < x$ and one or more oxides, nitrides, fluorides, carbides and sulfides of metals or semimetals (proviso provided that sulfides are excluded when the metal is Zinc).

In the present invention, the recording layer and/or the protective layers must include a specific amount of sulfur.

When the protective layers include a specific amount of sulfur, the protective layers comprise a mixture of $Zn_{(1-x)}S_x$ and one or more oxides, nitrides, fluorides, carbides and sulfides of metals or semimetals (proviso provided that the sulfides are excluded when the metal is Zinc), and a rate of sulfur atom numbers X in $Zn_{(1-x)}S_x$ must be larger than 0.50.

A rate of sulfur atom numbers X in $Zn_{(1-x)}S_x$ is calculated as follows. The rate of sulfur atom numbers X in conventional ZnS contained in a protective layer is 0.50. A protective layer comprising a mixture of $Zn_{(1-x)}S_x$ having a higher rate of X than that of the conventional one and the above-mentioned oxides and the like of metals or semimetals is subjected to an analysis with a fluorescent X-ray apparatus under the conditions mentioned below to measure an abundance ratio of sulfur atoms Y represented by the formula $Y=(S/(Zn+S))$. A protective layer comprising the same mixture except that ZnS is used in the place of $Zn_{(1-x)}S_x$ is also subjected to the analysis with a fluorescent X-ray apparatus under the same conditions to measure a standard value of the abundance ratio of sulfur atoms $Y_0$ represented by the formula $Y_0=(S/Zn+S)$. X is calculated from Formula (1):

$$X=0.5Y/Y_0 \tag{1}$$

When X is more than 0.50, phase-change type optical disks show an excellent overwrite cycles in the recording layer and reduce the deterioration of recording marks due to long term reading. Preferably, X is more than 0.5038. The above effects owing to the addition of sulfur are exhibited in that range.

One of the reasons why the effects of the present invention is attained by making X in the protective layer over 0.50 is the improvement in heat resistance of the protective layer. When the protective layers are prepared by carrying out sputtering by using a sintered target comprising a mixture of ZnS having X of 0.50 in $Z_{(1-x)}S_x$ and the above-mentioned oxides and the like of metals and semimetals, a vacancy in sulfur site of zinc-sulfide crystal appears in the resultant layers. By making X in $Zn_{(1-x)}S_x$ over 0.50, the gaps are filled with sulfur and growth of crystalline is accelerated due to orientation in the direction of growth of the layers. As a result, the heat resistance is improved.

In $Zn_{(1-x)}S_x$ of the protective layers of the present invention, the rate of sulfur atom numbers X is preferably 0.70 or less, more preferably 0.54 or less. X varies depending on the processes and conditions for forming films. It is supposed that the cyclability in the recording layers becomes better as X becomes larger than 0.50. Meanwhile, as X increases, the protective layers tend to deteriorate in quality and have a reduced life period. Accordingly, X is preferably 0.70 or less in view of the disk life. When X is 0.54 or less, the cyclability of the recording layer becomes better, and also a preservation disk life of over 10 years at room temperature which is required for an optical disk, i.e., a period where recorded data is preserved without deterioration, can be attained. In view of the preservation disk life, sulfur is preferably added only to the upper protective layer.

The materials forming protective layers with $Zn_{(1-x)}S_x$ include oxides such as $SiO_2$, SiO, $GeO_2$, MgO, $Al_2O_3$, $Ta_2O_5$, $ZrO_2$, $Y_2O_3$, $CeO_2$, $BaTiO_3$ and $SrTiO_3$, nitrides such as $Si_3N_4$ and AlN, fluorides such as $MgF_2$, LiF and $CaF_2$, carbides such as SiC, TiC and C, and sulfides such as SmS, SrS, PbS and CdS. Of these, glassy materials such as $SiO_2$, SiO, $GeO_2$, MgO, $Al_2O_3$, $Ta_2O_5$, $ZrO_2$, $Y_2O_3$, $CeO_2$, $Si_3N_4$, AlN, $MgF_2$, LiF and $CaF_2$ are preferable. From the standpoint of heat resistance, $SiO_2$, $Ta_2O_5$, $CeO_2$, $Si_3N_4$, $MgF_2$ are preferable. Particularly, $SiO_2$ is preferable. As for a composition ratio of both the components mentioned above, $SiO_2$ is preferably between 5 and 50 mol % according to the ratio for preparing protective layers. When $SiO_2$ is less than 5 mol %, the heat resistance is insufficient. When $SiO_2$ is more than 50 mol %, mechanical accuracy and preservation stability of the optical disks are deteriorated due to an increased film stress.

When the recording layer of the present invention contains a specific amount of sulfur, the protective layers can include one or more oxides, nitrides, fluorides, carbides and sulfides of metals or semimetals.

Thicknesses of the protective layers are not particularly restricted. When the protective layer is arranged on the side of the substrate, the thickness is preferably 5 nm or more in view of prevention of deforming the substrate and preservation stability, and 600 nm or less in view of mechanical accuracy and producibility. When the protective layer is arranged on the opposite side of the substrate, the thickness is preferably 5 nm or more in view of recording sensitivity and prevention of reduction of the erasing rate, and 300 nm or less in view of heat radiation of the recording layer. The reduction of the erasing rate is caused by a mixing of reflecting and recording layer.

When the protective layers do not contain the above-mentioned specific amount of sulfur, the recording layer must be represented by the formula $(Sb_aTe_bGe_c)_{100-d} \cdot S_d$, wherein $5 \leq a \leq 60$, $35 \leq b \leq 65$, $5 \leq c \leq 65$, $a+b+c=100$, $0<d \leq 40$.

The recording layer of the present invention is improved in cyclability and in the deterioration of the recording marks due to long term reading by the addition of sulfur. Sulfur is an element that has a high capability for making semiconductors and metals amorphous by being added to them, i.e., an element having high glass formability. It is supposed that, due to this glass formability of sulfur, Sb—Te—Ge—S alloy is, compared to Sb—Te—Ge alloy, increased in rigidity because of a reduced structural degree of freedom so that structural stability is enhanced, and also is reduced in reactivity because of increased active energy between amorphous state and crystalline state so that stability is enhanced. Consequently, deterioration of recording marks does not easily occur due to long term reading.

On the other hand, the larger the amount of sulfur added, the slower the crystallizing speed becomes since the structural degree of freedom is decreased. As mentioned above, the crystallizing speed needs to be appropriately greater than the linear velocity of optical disks. Although sulfur can be added in a large amount when the linear velocity of optical disks is slow, the amount of sulfur added is decreased along with the increase of the linear velocity.

When sulfur abundance ratio d in the recording layer of the present invention exceeds 40, there is high possibility of deterioration of the recording-erasing properties which is a basic feature of optical disks since sulfur is evaporated due to a rapid heating at recording. Sulfur is preferably contained at a ratio of 0.4 or more, more preferably 1 or more.

Crystallizing speed and a melting temperature are changed depending on the composition of Sb—Te—Ge alloy. The crystallizing speed slows down and erasing property is deteriorated when a Sb abundance ratio a exceeds 60 or when a Te abundance ratio b is less than 35 and more than 65. Information saved on such a disk cannot be erased even at slow linear velocity such as 1.2 m/s so that the disk cannot be used as an optical disk. Further, a melting temperature increases along with increase of a Ge abundance ratio c. When the Ge abundance ratio c exceeds 65, recording sensitivity is reduced so that such a disk is not suitable for practical use. When the Ge abundance ratio c is less than 5, the melting temperature and the crystallizing speed are reduced. As a result, recording marks are easily crystallized and deteriorated owing to long term reading and preservation.

When high speed recording-erasing which has been recently demanded for optical disks is required, each rate of atom numbers of the above components is preferably $5 \leq a \leq 50$, $45 \leq b \leq 60$, $5 \leq c \leq 50$ and $0<d \leq 20$.

When the above protective layers contain the specific amount of sulfur as defined above, the components of the recording layer can employ materials for a recording layer of the conventional recordable and erasable optical disks. For example, alloys prepared from chalcogen such as Te or Se, or In or Sb, e.g., Ge—Te—Sb, Ge—Te—Sb—S, Ge—Te—

Sn—Au, Ge—Te—Sb—Pd, Ge—Te—Sb—Ag, In—Sb—Tl, In—Sb—Te and In—Sb—Te—Ag, are preferred. Of these, Ge—Te—Sb and Ge—Te—Sb—S are particularly preferred because of their fast crystallizing speed. The recording layer of the present invention may further contains Pd, Pt, Ag, Au, Co, Pb, Bi, Hf, Nb, B, C and the like in an amount which does not deteriorate the effects of the present invention and the basic feature of optical disks.

Thickness of the recording layer is suitably decided depending on the demanded reflectivity, contrast and sensitivity. When the optical contrast and melting point of the chalcogen alloy to be used in the present invention are taken into consideration, the thickness is preferably 5 nm or more in view of contrast, and 100 nm or less in view of recording sensitivity and productivity.

As a transparent substrate suitable for the present invention, a transparent substrate which is conventionally used as a substrate for optical disks can be employed. It is preferred to employ polycarbonate, glass and the like which have good optical properties and high mechanical strength and which are excellent in stability of mechanical characteristics.

The phase-change type optical disk of the present invention may have a metallic thin film between the transparent substrate and the protective layer. The metallic layer reduces an apparent difference of heat property between amorphous and crystalline areas of the recording layer by controlling their optical absorption factor to increase temperatures of the amorphous and crystalline areas of the recording layer to the same level. The metals include Au, Ag, Si and Cu. The thickness of the film is preferably about 5 to 30 nm.

The phase-change type optical disk of the present invention may have a reflecting layer comprising metals such as Al, Cr, Ni, Au, Hf, Pd and Ti or an alloy thereof on the side opposite to the light incident side of the recording layer. A layer comprising UV-curable resin such as urethane type, acryl type, silicone type and polyester type and adhesive agents such as hot melt type may be arranged on the side of the reflecting layer, which does not face to the recording layer, in order to protect and strengthen the reflecting layer.

The phase-change type optical disk of the present invention can be prepared by forming protective layers, recording layers, reflecting layers and films such as a metallic film on transparent substrates using a commercially available sputtering apparatus and adhering two of the resultant substrates with the layer formed sides.

In order to form the protective layers on and directly under the recording layer, a deposition process, a sputtering process and other known processes are generally employed. From the standpoint of productivity, the sputtering process is superior to the deposition process. The sputtering process is suitable in the case of mass-production.

Processes for forming protective layers comprising a mixture of two or more substances as mentioned above by sputtering include a co-sputtering process wherein the substances composing the above mixture are separately sputtered and a process wherein materials prepared by mixing and sintering powders of the substances composing the above mixture are sputtered. Of these, the latter process is preferred since a layer composition is more easily changed in this process than the former process and facilities are relatively simple.

In order to make X in $Zn_{(1-x)}S_x$ of the protective layers over 0.50, it is preferred to carry out sputtering by using a sintered target including $H_2S$ in an amount of between 200 ppm and about 2000 or 3000 ppm.

Sintered targets including the desired amount of $H_2S$ can be obtained by sintering powdered materials of the protective layers including $H_2S$, whose total amount is adjusted to a specified amount, with a commercially available sintering machine, or by sintering powdered materials of the protective layers while introducing $H_2S$ gas into an atmosphere of sputtering.

Moreover, in order to make X over 0.50, it is preferred to carry out sputtering by using a sintered target including 0.1 to 0.05 % by weight of sulfur per target.

Sintered targets containing the desired amount of sulfur can be obtained by sintering powdered materials of the protective layers including sulfur, whose total amount is adjusted to a specified amount, with a commercially available sintering machine, or by sintering powdered materials of the protective layers while introducing sulfur gas into the atmosphere.

Another process for making X over 0.50 includes a process comprising introducing $H_2S$ or sulfur (gas) into an atmosphere of sputtering. When a deposition rate of a film is 1.2 Å/sec, 0.2 to 1.0% by volume of $H_2S$ is preferably introduced into the atmospheric gas for sputtering. As the above atmospheric gas for sputtering, a mixed gas of Ar and H2S or a mixed gas of Ar and sulfur (gas) may be employed.

Of the above processes, a process wherein X is adjusted with an atmospheric gas for sputtering is preferable.

For including $d \leq 40$ of sulfur in the recording layer, powder of Sb—Te—Ge alloy is mixed with powder of $H_2S$ or sulfur and sintered with a commercially available sintering machine so that a rate of sulfur atom numbers d be a specified value in the above-mentioned range, or powder of sulfide compounds such as antimony sulfide, tellurium sulfide and germanium sulfide is preliminarily mixed and sintered so that a rate of sulfur atom numbers d be a specified value in the above-mentioned range. The sputtering may be carried out using a Sb—Te—Ge—S target obtained by sintering in an atmospheric gas including $H_2S$ or sulfur as a target. The sulfur abundance ratio can be adjusted by sputtering Sb—Te—Ge alloy using a mixed gas of Ar and $H_2S$ or a sulfur gas as an atmospheric gas.

Figure 1:
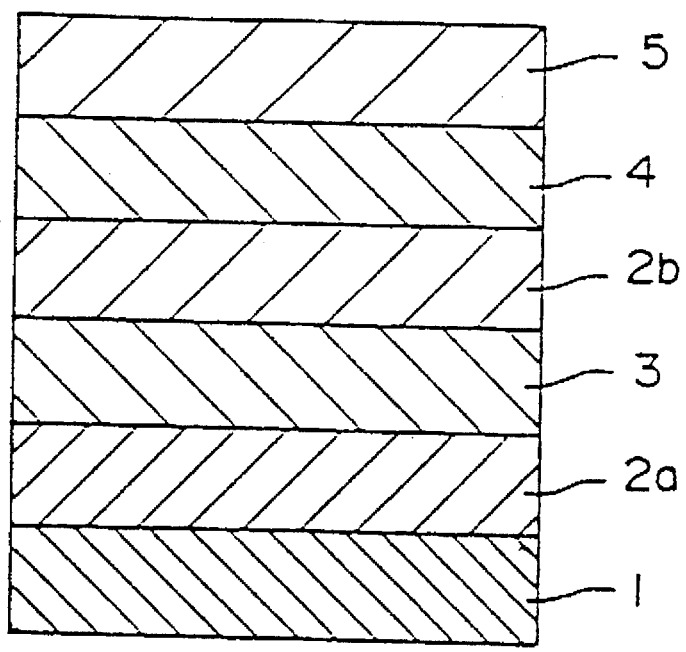
FIG. 1 shows a cross-sectional view of a layer structure of the phase-change type optical disk prepared in the Examples.

1: substrate
2a: protective layer
2b: protective layer
3: recording layer
4: reflecting layer
5: UV-curable resin layer

BEST MODE FOR CARRRYING OUT THE INVENTION

Hereinafter, the present invention is illustrated in more detail referring to the Examples.

In the Examples, the fluorescent X-ray measuring apparatus used and conditions for measurement employed are as follows.

Model: PW2400 manufactured by PHILIPS INTERNATIONAL B. V.

X-ray tube: rhodium

Mask diameter: 20 mm

| Element | Exitation conditions | Slit width | Detector | Spectral crystalline |
| --- | --- | --- | --- | --- |
| Si | 24 kv, 125 mA | 0.3 mm | FL | InSb |
| Zn | 60 kv, 50 mA | 0.1 mm | DU | LiF200 |
| S | 24 kv, 125 mA | 0.3 mm | FL | Ge |

EXAMPLE 1

Phase-change type optical disk Nos. 1-1 to 1-5 having the layer structure shown in FIG. 1 were prepared as follows.

According to RF (radiofrequency) sputtering, a 180 nm thick protective layer 2a comprising $Zn_{(1-x)}S_x$ and $SiO_2$ was deposited on a grooved side of a polycarbonate substrate 1, which had a hole at the center, a diameter of 130 nm and a thickness of 1.2 mm and one side of which was grooved at 1.6 μm pitch. Targets used were prepared by mixing ZnS powder with $SiO_2$ powder at a molar ratio of ZnS to $SiO_2$ of 80 to 20 and sintering the mixture in a $H_2S$ atmosphere. $H_2S$ in each sinter was adjusted to 200 to 1000 ppm. The concentration of $H_2S$ was obtained by reacting $H_2S$ in each sinter with a solution containing Cu ions to measure an amount of CuS and calculating an amount of S from the amount of CuS. When protective layer 2a was formed, the conditions for sputtering were not changed except the types of targets were varied.

A 25 nm thick recording layer 3 comprising $Sb_{22}Te_{55}Ge_{23}$ alloy was deposited on the protective layer 2a according to sputtering. On the recording layer, 20 nm thick protective layer 2b comprising $Zn_{(1-x)}S_x$ and $SiO_2$ was deposited using the same target and according to the same procedure as protective layer 2a.

Value X of $Zn_{(1-x)}S_x$ in the protective layers 2a and 2b were obtained by measuring, concerning each sample, an abundance ratio of sulfur atoms Y=(S/(Zn+S)) according to an analysis using a fluorescent X-ray apparatus and also measuring, concerning a film obtained from a target containing no $H_2S$, an abundance ratio of sulfur atoms $Y_0$=(S/(Zn+S)) according to the same procedure as in the case of the samples, followed by a calculation based on the above-mentioned Formula (1).

The amount of $H_2S$ contained in a target used in forming protective layers 2a and 2b of each sample and the measured value of X in the protective layers 2a and 2b are shown in Table 1.

Next, a 200 nm thick reflecting layer 4 comprising Al alloy was arranged on a protective layer 2b according to sputtering, and further 10 μm thick UV-curable resin 5 was applied according to a spin coat process to harden.

Properties of each sample of the resultant phase-change type optical disk were measured according to the following methods.

(1) Measurement of number of overwrite cycles

In order to evaluate cyclability, the number of overwrite cycles was obtained according to the following process. Each sample was set on a drive unit, and rotated at a linear velocity of about 5 m/s. A laser having a wave length of 830 nm was modulated between a peak power of 18 mW and a bias power of 9 mW. The sample was repeatingly overwritten with a pattern wherein 1.5 T signal and 4.0 T signal appear in turns on the same track. Then, the relation between the overwriting number and C/N (a ratio of carrier wave to noise) was determined. The number of overwrite cycles at the time when the initial value of C/N is reduced by 3 dB is shown in Table 1 as "a number of overwrite cycles".

As the amount of $H_2S$ in targets increases, i.e., as X becomes larger, the number of overwrite cycles is raised. When X is 0.51 or more, a preferable cyclability is attained.

(2) Measurement of number of error correctable cycles

In order to determine the improvement in durability against the changes of film thickness of the recording layer owing to a transmittance of substances in the recording layer and other factors, a cyclability was evaluated by actually recording data, not by C/N. Each sample was set on the drive unit used in above (1) and evaluated by recording data at constant linear velocity, peak power and bias power under the same conditions as in (1). A random pattern was employed for recording data. The number of error correctable cycles is shown in Table 1 as the number of cyclability which gives correctable error numbers of data read-out.

As the amount of $H_2S$ in targets increases, i.e., as X becomes larger, the possible number of readout is raised. When X is 0.51 or more, preferable cyclability is attained.

(3) Deterioration of recording marks due to long term reading

In order to evaluate long-term resistance of recording marks to a read laser, each sample was repeatedly reproduced at a read power of 2.0 mW to determine the relation between exposing numbers (pass numbers) of the read laser and C/N of a reproducing signal. A pass number, i.e., C/N is decreased from the initial value by 1 dB is defined as "resistance of recording marks to a read laser" and is shown in Table 1.

As the amount of $H_2S$ in targets increases, i.e., X becomes larger, the resistance to the read laser is improved. When X is 0.51 or more, good resistance to the read laser can be obtained.

EXAMPLE 2

Sample Nos. 2-1 to 2-4 of phase-change type optical disks were prepared according to the same procedure as in Example 1 except that targets obtained by sintering ZnS powder and $SiO_2$ powder (molar ratio of $ZnS:SiO_2$=80:20) and sulfur powder at a ratio shown in Table 2 were employed to form protective layers 2a and 2b.

Value X of $Zn_{(1-x)}S_x$ in the protective layers 2a and 2b was obtained by measuring an abundance ratio of sulfur atoms Y of each sample and an abundance ratio of sulfur atoms $Y_0$ of Sample No. 2-1 obtained from a target containing no $H_2S$ according to the same procedure as in Example 1, followed by a calculation based on Formula (1).

Each property of the samples of the obtained phase-change type optical disks was measured according to the same procedure as in Example 1. The results are shown in Table 2.

The optical disks of the present invention improved in all the properties, compared to Sample No. 2-1 which does not contain sulfur powder.

EXAMPLE 3

Sample Nos. 3-1 to 3-5 of phase-change type optical disks were prepared according to the same procedure as in Example 1 except that targets obtained by sintering a mixture of ZnS powder and $SiO_2$ powder (molar ratio of $ZnS:SiO_2$=80:20), adjusting a $H_2S$ concentration to 200 ppm and using a gas prepared by mixing Ar gas with 10% by volume of $H_2S$ gas at a ratio shown in Table 3 as an atmosphere for sputtering were employed to form protective layers 2a and 2b.

Each property of the samples of the obtained phase-change type optical disks was measured according to the same procedure as in Example 1. The results are shown in Table 3. When value X is 0.51 or more, a good cyclability and good resistance to a read laser can be obtained.

EXAMPLE 4

Sample Nos. 4-1 to 4-6 of phase-change type optical disks were prepared according to the same procedure as in Example 1 except that targets obtained by sintering ZnS powder and $SiO_2$ powder (molar ratio of $ZnS:SiO_2=70:30$) and sulfur powder at a ratio shown in Table 2 were employed to form protective layers 2a and 2b.

Value X of $Zn_{(1-x)}S_x$ in the protective layers 2a and 2b were obtained by measuring an abundance ratio of sulfur atoms Y of each sample and an abundance ratio of sulfur atoms $Y_0$ of Sample No. 4-1 obtained from a target containing no $H_2S$ according to the same procedure as in Example 1, followed by a calculation based on Formula (1).

Each sample of the resultant phase-change type optical disks was set on a drive unit to record data according to the same procedure as in Example 1. Then each sample was kept in a constant temperature and humidity oven, the inside of which is adjusted to a temperature of 80° C. and a relative humidity of 80%, to determine the deterioration of the recorded data per each prescribed preservation period.

In general, optical disks are required for a preservation life period of 10 years or more at room temperature. Since the activation energy of a phase-change type optical disk which employs a Sb—Te—Ge type alloy for a recording layer is about 1.1 eV, the life period of 500 hours or more which was determined by an accelerating aging test under the condition of a temperature of 80° C. and a relative humidity of 80% (hereinafter, "an estimated life") corresponds to a preservation period of 10 years or more at room temperature. In this Example, the time when the initial value of C/N is decreased by 3 dB is defined as a life period of an optical disk, and the estimated life of each sample was measured. The results are shown in Table 4. When value X is 0.54 or less, a preservation life period of 10 years or more at room temperature can be obtained.

EXAMPLE 5

A phase-change type optical disk having the layer structure shown in FIG. 1 was prepared as follows. 180 nm thick protective layer 2a was deposited on a grooved side of a substrate 1 as used in Example 1 by sputtering a target comprising a mixture of ZnS and $SiO_2$ (molar ratio of $ZnS:SiO_2=80:20$) according to RF sputtering. Then, 25 nm thick recording layer 3 comprising Sb—Te—Ge—S type alloy was deposited on the protective layer 2a, and 20 nm thick protective layer 2b was deposited using the same target and procedure as protective layer 2a. Further, 200 nm thick reflecting layer comprising Al alloy was deposited on the protective layer 2b. Finally, UV-curable resin 5 was applied to be 10 μm thick with a spin coater and hardened by a ultraviolet light.

When the recording layer 3 was formed, the composition of the Sb—Te—Ge alloy was kept constant (Sb: 25 at %; Te: 55 at %; Ge: 20 at %) and sulfur was added to the composition at a ratio shown in Table 5 to prepare a target. Then, sputtering was carried out to obtain a film. The ratios a, b, c, and d of each atom contained in the resultant film was calculated by a fluorescent X ray measurement. The results are shown in Table 5.

Each property of each sample of the resultant phase-change type optical disks was measured according to the same procedure as in Example 1. The results are shown in Table 5.

As the sulfur content d increases, the number of overwrite cycles and the number of error correctable cycles are increased so that resistance to a read laser is improved.

Further, in order to determine the basic characteristics as an optical disk, each sample was set on a drive unit and rotated at 1800 rpm. A laser beam having a wavelength of 830 nm was modulated between a peak power of 18 mW and a bias power of 9 mW to overwrite a pattern of 3.7 MHz (Duty ratio of 50%) corresponding to 1.5 T 100 times. The recording property is shown in Table 5. Sample Nos. 5-1 to 5-4 were recordable ( ). Sample No. 5 having d of 43 was unrecordable (X) due to a hole in the metallic layer made by the laser beam.

EXAMPLE 6

A phase-change type optical disk having the layer structure as shown in FIG. 1 was prepared according to the same procedure as in Example 5 except that the sulfur content in the alloy was adjusted to 10 at % and a target prepared by adding Sb—Te—Ge alloy to the alloy at a ratio shown in Table 6 was employed for sputtering. The ratios a, b, c, and d of each atom contained in the resultant film was calculated by a fluorescent X ray measurement. The results are shown in Table The erasing property, the basic characteristics of the resultant phase-change type optical disk, was evaluated according to the following manner. Each sample was set on a drive unit and a laser beam having a wavelength of 830 nm was modulated between a peak power of 12 mW and a bias power of 6 mW to record a 1.5 T pattern. Then, each sample was rotated at 600 rpm to erase the pattern by unmodulating DC radiation of laser beam and it was observed whether or not an erasing ratio of 1.5 T was saturated with one time erasing operation. The results are shown in Table 6. When an erasing ratio is saturated with one time erasing operation, it is shown by "0". When an erasing ratio is not saturated with one time erasing operation, it is shown by "X". The erasing ratios of sample Nos. 6-2 to 6-4 which are included in the present invention were saturated with one time erasing operation.

EXAMPLE 7

A phase-change type optical disk having the layer structure as shown in FIG. 1 was prepared according to the same procedure as in Example 5 except that sulfur content in the alloy was adjusted to 10 at % and a target prepared by adding Sb—Te—Ge alloy to the alloy at a ratio shown in Table 7 was employed for sputtering. The ratios a, b, c, and d of each atom contained in the resultant film was calculated by a fluorescent X ray measurement. The results are shown in Table 7.

For the purpose of evaluating data preservation property, a basic characteristic of the resultant phase-change type optical disk, an accelerating test of the disk was carried out according to the following manner. Each sample was set on a drive unit and rotated at 1800 rpm. A laser beam having a wavelength of 830 nm was modulated between a peak power of 18 mW and a bias power of 9 mW to record pattern. After a random pattern was recorded, samples were put in a constant temperature and humidity oven at 80° C. and 80% RH (relative humidity). 1,000 hours later, the data were read out to evaluate preservation stability of recording marks with a byte error rate of the data. The results are shown in Table 7. When the byte error rate was less than 3 times as large as that of the data before putting the samples in the constant temperature and humidity oven, the preservation stability is defined as good ( ). When the byte error rate is not less than 3 times as large as that of the data before putting samples in the constant temperature and humidity oven, it is defined as poor (X). Sample Nos. 7-2 to 7-4 of the present invention were good in preservation stability. To the contrary, the byte error rate of Sample No. 7-1 was over 3 times so that the preservation stability of the recoding marks was poor.

EXAMPLE 8

A phase-change type optical disk having the layer structure as shown in FIG. 1 was prepared according to the same procedure as in Example 5 except that the sulfur content of the alloy was adjusted to 10 at % and a target prepared by adding Sb—Te—Ge alloy to the alloy at a ratio shown in Table 8 was employed for sputtering. The ratios a, b, c and d of each atom contained in the resultant film was calculated by a fluorescent X ray measurement. The results are shown in Table 8.

The recording property, the basic characteristic of the resultant phase-change type optical disk, was evaluated according to the following manner. Each sample was set on a drive unit and rotated at 1800 rpm. Evaluation was carried out using a laser beam having a wavelength of 830 nm whose bias power was fixed at 9 mW and peak power was varied. Samples are evaluated as follows. When a minimum peak power whose value of C/N is over 50 dB is not more than 20 mW, a sample is recordable (◯). When a power of 20 mW cannot provide 50 dB of C/N, a sample is unrecordable (X). Sample Nos. 8-2 and 8-3 of the present invention were recordable due to 20 mW or less of recording sensitivity. To the contrary, Sample No. 8-1 was unrecordable since the recording sensitivity exceeds 20 mW.

EXAMPLE 9

A protective layer was deposited on a transparent substrate according to the same procedure as in Example 1. Then, a recording layer was formed on the protective layer according to the same procedure as in Example 5 to prepare a phase-change type optical disk having the layer structure shown in FIG. 1. When the protective layers $2a$ and $2b$ were formed, the target used for Sample No. 2-3 of Example 2 was employed. When the recording layer 3 was formed, the target used for Sample No. 5-2 of Example 5 was employed.

The resultant phase-change type optical disk was evaluated in accordance with the same manner as in Example 1 to determine the number of error correctable cycles. The number of error correctable cycles of the phase-change type optical disk was 1'10$^6$. This number was larger than that of Comparative Example by 880,000, and was about 10 times as large as that of Comparative Example in ratio.

Comparative Example

A phase-change type optical disk was prepared and evaluated according to the same procedure as in Example 1 except sulfur powder was not added and a mixed gas of Ar gas and nitrogen gas was used as an atmospheric gas for sputtering at the time of forming the protective layers $2a$ and $2b$ to determine a number of error correctable cycles. The number of overwrite cycles, the number of error correctable cycles and a resistance of recording marks to a read laser of the resultant phase-change type optical disk were $2.5 \times 10^3$, $1.2 \times 10^5$ and $2 \times 10^6$, respectively.

Industrial Applicability

The present invention can provide a phase-change type optical disk improved in cyclability, i.e., number of overwrite cycles and error correctable cycles, of the recording layer and reduced in the deterioration of recording marks due to long term reading, which optical disk is attained by including a specific amount of sulfur in a recording layer or protective layers.

Particularly, by setting X between 0.50 and 0.54, a phase-change type optical disk having a preservation life period of over 10 years at room temperature, which is required for optical disks, in addition to the above properties can be obtained. According to the present invention, phase-change type recordable and erasable optical disk having high reliability for recording data can be obtained.

According to the process for producing the phase-change type optical disk of phase-change invention, a phase-change type optical disk having the above characteristics, which comprises protective layers of $Zn_{(1-x)}S_x$ wherein $x>0.50$ and/or a recording layer of $(Sb_aTe_bGe_c)_{100-d} \cdot S_d$ alloy having a specific ratio of atom numbers wherein $0<d \leq 40$ can be easily produced on a large scale.

TABLE 1

| | Sample No. | | | | |
|---|---|---|---|---|---|
| | 1-1 | 1-2 | 1-3 | 1-4 | 1-5 |
| Amount of H$_2$S (ppm) | 200 | 400 | 500 | 700 | 1000 |
| X | 0.51 | 0.55 | 0.57 | 0.61 | 0.68 |
| Number of overwrite cycles | $4 \times 10^3$ | $7.5 \times 10^3$ | $1.2 \times 10^4$ | $1.7 \times 10^4$ | $5 \times 10^4$ |
| Number of error correctable cycles | $1.5 \times 10^5$ | $6 \times 10^5$ | $8 \times 10^5$ | $9 \times 10^5$ | $1 \times 10^6$ |
| Resistance to read laser power | $3 \times 10^6$ | $1 \times 10^7$ | $>10^7$ | $>10^7$ | $>10^7$ |

TABLE 2

| | Sample No. | | | | |
|---|---|---|---|---|---|
| | 2-1 | 2-2 | 2-3 | 2-4 | 2-5 |
| Amount of sulfur (wt. %) | 0 | 0.5 | 1.0 | 2.0 | 5.0 |
| X | 0.50 | 0.504 | 0.51 | 0.54 | 0.70 |
| Number of overwrite cycles | $2.5 \times 10^3$ | $7 \times 10^3$ | $3 \times 10^4$ | $5 \times 10^4$ | $1.5 \times 10^4$ |
| Number of error correctable cycles | $7 \times 10^4$ | $1 \times 10^5$ | $2 \times 10^5$ | $5 \times 10^5$ | $1 \times 10^6$ |
| Resistance to read laser power | $2 \times 10^6$ | $4 \times 10^6$ | $6 \times 10^6$ | $1 \times 10^7$ | $>10^7$ |

TABLE 3

| | Sample No. | | | | |
|---|---|---|---|---|---|
| | 3-1 | 3-2 | 3-3 | 3-4 | 3-5 |
| Ar flow rate* | 100 | 99 | 98 | 95 | 92 |
| 10 vol % H$_2$S flow rate* | 0 | 1 | 2 | 5 | 8 |

TABLE 3-continued

| | Sample No. | | | | |
|---|---|---|---|---|---|
| | 3-1 | 3-2 | 3-3 | 3-4 | 3-5 |
| Amount of sulfur (wt. %) | 0 | 0.1 | 0.2 | 0.5 | 0.8 |
| X | 0.51 | 0.52 | 0.53 | 0.56 | 0.59 |
| Number of overwrite cycles | $4 \times 10^3$ | $8 \times 10^3$ | $3 \times 10^4$ | $5 \times 10^4$ | $1 \times 10^5$ |
| Number of error correctable cycles | $2 \times 10^5$ | $4 \times 10^5$ | $5 \times 10^5$ | $7 \times 10^5$ | $1 \times 10^6$ |
| Resistance to read laser power | $3 \times 10^6$ | $7 \times 10^6$ | $1 \times 10^7$ | $>10^7$ | $>10^7$ |

*Flow rate per minute (cm)

TABLE 4

| | Sample No. | | | | | |
|---|---|---|---|---|---|---|
| | 4-1 | 4-2 | 4-3 | 4-4 | 4-5 | 4-6 |
| Amount of sulfur (wt. %) | 0 | 1.1 | 1.9 | 3.2 | 5.9 | 6.5 |
| X | 0.50 | 0.506 | 0.511 | 0.515 | 0.54 | 0.55 |
| Estimated life | 2000≧ | 2000≧ | 2000≧ | 1800 | 600 | 300 |

TABLE 5

| | Sample No. | | | | |
|---|---|---|---|---|---|
| | 5-1 | 5-2 | 5-3 | 5-4 | 5-5 |
| d (sulfur) | 0.0 | 2.0 | 13.0 | 29.0 | 43.0 |
| Number of overwrite cycles | $2.5 \times 10^3$ | $1 \times 10^5$ | $5 \times 10^5$ | $1 \times 10^6$ | $>10^6$ |
| Number of error correctable cycles | $1.5 \times 10^5$ | $6 \times 10^5$ | $8 \times 10^5$ | $9 \times 10^5$ | $1 \times 10^6$ |
| Resistance to read laser power | $2 \times 10^6$ | $1 \times 10^7$ | $>10^7$ | $>10^7$ | $>10^7$ |
| Recording property | ○ | ○ | ○ | ○ | X |

TABLE 6

| | Sample No. | | | | |
|---|---|---|---|---|---|
| | 6-1 | 6-2 | 6-3 | 6-4 | 6-5 |
| Sb (a) | 15.0 | 20.0 | 25.0 | 30.0 | 35.0 |
| Te (b) | 70.0 | 60.0 | 50.0 | 40.0 | 30.0 |
| Ge (c) | 15.0 | 20.0 | 25.0 | 30.0 | 35.0 |
| Erasing property | X | ○ | ○ | ○ | X |

TABLE 7

| | Sample No. | | | |
|---|---|---|---|---|
| | 7-1 | 7-2 | 7-3 | 7-4 |
| Sb (a) | 47.5 | 45.0 | 40.0 | 30.0 |
| Te (b) | 50.0 | 50.0 | 50.0 | 50.0 |

TABLE 7-continued

| | Sample No. | | | |
|---|---|---|---|---|
| | 7-1 | 7-2 | 7-3 | 7-4 |
| Ge (c) | 2.5 | 5.0 | 10.0 | 20.0 |
| Preservation property | X | ○ | ○ | ○ |

TABLE 8

| | Sample No. | | |
|---|---|---|---|
| | 8-1 | 8-2 | 8-3 |
| Sb (a) | 2.5 | 7.5 | 15.0 |
| Te (b) | 50.0 | 50.0 | 50.0 |
| Ge (c) | 47.5 | 42.5 | 35.0 |
| Recording property | X | ○ | ○ |

What is claimed is:

1. A phase-change optical disk comprising a transparent substrate; a recording layer arranged on the transparent substrate wherein a phase-change occurs between crystalline state and amorphous state according to laser power irradiation; and protective layers arranged on and directly under the recording layer; wherein at least one of the protective layers comprises a mixture of $Zn_{(1-x)}S_x$ wherein $0.50<x$ and one or more oxides, nitrides, fluorides, carbides and sulfides of metals or semimetals, with a proviso provided that sulfides are excluded when the metal is zinc.

2. The phase-change optical disk according to claim 1, wherein said at least one of said protective layers contains $Zn_{(1-x)}S_x$ wherein $0.50<x\leq0.70$.

3. The phase-change optical disk according to claim 1, wherein said at least one of said protective layers contains $Zn_{(1-x)}S_x$ wherein $0.50<x<0.54$.

4. The phase-change optical disk according to claim 3, wherein both of said protective layers comprise said mixture and $Zn_{(1-x)}S_x$ satisfies the relationship $0.50<x\leq0.54$.

5. The phase-change optical disk according to claim 1, wherein said at least one of said protective layers comprises said $Zn_{(1-x)}S_x$ and further comprises $SiO_2$.

6. The phase-change optical disk according to claim 5, wherein a composition ratio of $Zn_{(1-x)}S_x$ to $SiO_2$ in said at least one protective layer is in the range of from 95:5 to 50:50 (molar ratio).

7. The phase-change optical disk according to claim 5, wherein both of said protective layers comprise said mixture and $Zn_{(1-x)}S_x$ satisfies the relationship $0.50<x \leq0.54$.

8. The phase-change optical disk according to claim 1, wherein the composition of said recording layer is represented by the formula $(Sb_aTe_bGe_c)_{100-d} \cdot S_d$, wherein $5\leq a\leq60$, $35\leq b\leq65$, $5\leq c\leq65$, $a+b+c=100$ and $0<d\leq40$.

9. The phase-change optical disk according to claim 8, wherein a rate of atom numbers of each component in $(Sb_aTe_bGe_c)_{100-d} \cdot S_d$ of the recording layer is $5\leq a\leq50$, $45\leq b\leq60$, $5\leq c\leq50$, $a+b+c=100$, and $0<d\leq20$.

10. The phase-change optical disk according to claim 8, wherein a ratio of sulfur atom numbers in $(Sb_aTe_bGe_c)_{100-d} \cdot S_d$ of the recording layer is 0.4 to 40.

11. The phase-change optical disk according to claim 8, wherein both of said protective layers comprise said mixture and $Zn_{(1-x)}S_x$ satisfies the relationship $0.50<x\leq0.70$.

12. The phase-change optical disk according to claim 1, wherein both of said protective layers comprise said mixture and $Zn_{(1-x)}S_x$ satisfies the relationship $0.50<x\leq0.70$.

13. A process for preparing a phase-change optical disk, which comprises forming a protective layer on a transparent substrate, forming a recording layer on said protective layer, which exhibits a phase-change between a crystalline state and an amorphous state according to laser power irradiation, and forming a second protective layer on said recording layer;

wherein at least one of the protective layers comprises a mixture of $Zn_{(1-x)}S_x$ wherein $0.50<x$ and one or more oxides, nitrides, fluorides, carbides and sulfides of metals or semimetals, with a proviso provided that sulfides are excluded when the metal is zinc.

14. The process for preparing a phase-change optical disk according to claim 13, wherein said at least one of said protective layers is formed by sputtering using a sintered target containing $H_2S$ or sulfur.

15. The process for preparing a phase-change optical disk according to claim 13, wherein said at least one of said protective layers is formed using a sputtering method that employs a mixed gas of Ar and sulfur (gas) or a mixed gas of Ar and $H_2S$ as an atmospheric gas for sputtering.

16. The process for preparing a phase-change optical disk according to claim 13, wherein said recording layer is formed by sputtering using a sintered target containing antimony sulfides, tellurium sulfides, germanium sulfides and sulfur.

* * * * *